United States Patent [19]

Katayama et al.

[11] Patent Number: 5,123,934
[45] Date of Patent: Jun. 23, 1992

[54] CERAMICS COATED CEMENTED-CARBIDE TOOL WITH HIGH-FRACTURE RESISTANCE

[75] Inventors: Sakae Katayama; Masayuki Hashimura, both of Sagamihara; Hiroto Imamura, Kitakyushu; Tetsuo Sawashima, Neyagawa, all of Japan

[73] Assignees: Nippon Steel Corporation; Nippon Hardmetal Co., Ltd., both of Tokyo; Toho Kinzoku Co., Ltd., Osaka, all of Japan

[21] Appl. No.: 576,950

[22] Filed: Sep. 4, 1990

[30] Foreign Application Priority Data

Sep. 4, 1989 [JP] Japan .................................. 1-227612
Sep. 4, 1989 [JP] Japan .................................. 1-227613
Nov. 9, 1989 [JP] Japan .................................. 1-290034

[51] Int. Cl.[5] ............................................. B24B 1/00
[52] U.S. Cl. ........................................ 51/295; 51/309
[58] Field of Search ................................ 51/295, 309

[56] References Cited

U.S. PATENT DOCUMENTS

| | | | |
|---|---|---|---|
| 4,234,661 | 11/1980 | Lee et al. | 51/295 |
| 4,240,807 | 12/1980 | Kronzer | 51/295 |
| 4,377,371 | 3/1983 | Wisander et al. | 415/174 |
| 4,441,894 | 4/1984 | Sarin et al. | 51/295 |
| 4,469,489 | 9/1984 | Sarin et al. | 51/295 |

FOREIGN PATENT DOCUMENTS 2736982 3/1979 Fed. Rep. of Germany .
58-157965 9/1983 Japan .
64-31972 2/1989 Japan .

OTHER PUBLICATIONS

Interrupted Cutting Tests of Cemented Carbide Tools Coated by Physical Vapor Deposition and Chemical Vapor Deposition Techniques, Thin Solid Films, vol. 96, No. 1, Oct. 1982, Kodama, et al.

*Primary Examiner*—William R. Dixon, Jr.
*Assistant Examiner*—Willie J. Thompson
*Attorney, Agent, or Firm*—Pollock, Vande Sande & Priddy

[57] ABSTRACT

A cemented carbide tool of excellent wear resistance and fracture resistance includes a substrate of cemented carbide, and a ceramic coating layer by chemical vapor deposition. The thickness of the layer is in the range of between 2 μm to 20 μm, and the layer has cracks of such a depth that the cracks extend perpendicularly from a surface of the layer to the substrate. The cracks are formed in a network-like pattern to minutely divide the layer. The average value of the depths of the cracks in a direction perpendicular to the surface of the layer is not less than the thickness of the layer and not more than a value equal to the coating thickness plus 5 μm. The average value of widths of the cracks is not more than 2 μm. The average value of intervals between the cracks is not less than 10 μm and not more than 100 μm.

5 Claims, 1 Drawing Sheet

100μm

100μm

5μm

CERAMICS COATED CEMENTED-CARBIDE TOOL WITH HIGH-FRACTURE RESISTANCE

BACKGROUND OF THE INVENTION

This invention relates to a cutting tool for interrupted turning use.

As a material for cutting tools, there is commonly used cemented carbide composed of a ceramics phase (such as carbide or carbo-nitride) and a metal phase (such as cobalt and nickel) when a steel member is cut by a cemented carbide tool, the metal phase adheres to the steel member, so that the cemented carbide tool is liable to wear.

For this reason, conventionally, crystalline or amorphous ceramics which can not easily adhere to steel is coated on a cemented carbide tool by chemical vapor deposition (CVD) or physical vapor deposition (PVD). In the formation of such ceramic coating, care is taken to prevent the generation of internal defects, such as voids and cracks, as much as possible. The tool coated by means of a CVD process is superior in wear resistance but is inferior in fracture resistance to the tool coated by means of a PVD process. The reason for this is as follows.

The processing temperature in the CVD process is so high that the diffusion occurs between the coating layer and the substrate to provide sufficient adhesion. Therefore, the wear resistance of the cemented carbide tool coated by CVD process is particularly excellent. However, cracks produced in the deposited crystalline or amorphous ceramics, propagate into the substrate, and therefore there is encountered a disadvantage that the cutting tool coated by a CVD process is liable to occur fracture. According to a literature, "Cemented Carbides and Sintered Hard Materials" Hisashi Suzuki, by Maruzen Publish. Co. (Tokyo), 1986, p. 218. Deposition of ceramics lowers the rupture strength by 50%. For the purpose of improving the rupture strength of the coating layer, extensive study has been made with respect to coating conditions related to the thickness of the coating layer, the particle size of its crystals and its crystalline structure, as well as a heat treatment after coating. However, satisfactory results have not yet been achieved. The fracture resistance decreases with increase of the thickness of the coating layer, and for this reason, the thickness of the coating layer of the existing cutting tool is in the range of between several micron ($\mu$m) and about 10 $\mu$m. On the other hand, the wear resistance can be enhanced in proportion to the thickness of the ceramic coating, and therefore if any method of improving the fracture resistance of the coating layer is found, it will become possible to develop a tool which has a further greater coating thickness and hence is more excellent in wear resistance.

SUMMARY OF THE INVENTION

It is therefore an object of this invention to provide a coated cemented carbide tool which is more excellent in wear resistance and fracture resistance.

According to the present invention, there is provided a cemented carbide tool of excellent wear resistance and fracture resistance comprising a substrate of cemented carbide and a ceramic coating layer by a CVD process;

the thickness of the coating layer being in the range of between 2 $\mu$m and 20 $\mu$m, the coating layer having cracks of such a depth that the cracks extend perpendicularly from a surface of the coating layer to the substrate;

the cracks being form in a network-like pattern to minutely divide the coating layer; and the cracks meeting the following requirements:

(A) the average value of the depths of the cracks in a direction perpendicular to the surface of the coating layer being not less than the thickness of the coating layer and not more than a value equal to the coating thickness plus 5 $\mu$m;

(B) the average value of widths of the cracks being not more than 2 $\mu$m; and (C) the average value of intervals between the cracks being not less than 10 $\mu$m and not more than 100 $\mu$m.

The ceramic coating layer is made of at least one material selected from the group consisting of TiC, Ti(C,N), $Al_2O_3$ and TiN.

The substrate can be made of WC-based cemented carbide, TiC-based cemented carbide, or Ti(C,N)-based cemented carbide.

The cracks can be formed in the ceramic coating layer by blasting hard particles uniformly against the entire surface of the ceramic coating layer formed on the substrate. The material for the hard particles is not particularly limited, and by suitably selecting the blasting velocity and the blasting angle relative to the coating, various materials such as steel and cast iron can be used. The size of the hard particle can be, for example, about 100 to about 1000 $\mu$m.

Instead of blasting the hard particles, there can be used a method in which a high-density energy beam is applied to the surface of the ceramic coating layer formed on the substrate to sequentially scan the entire surface of the coating layer so as to instantaneously heat and cool the scanned portion by self cooling mass, thereby forming the network-like cracks in the coating.

DETAILED DESCRIPTION OF THE INVENTION

Figure 1:
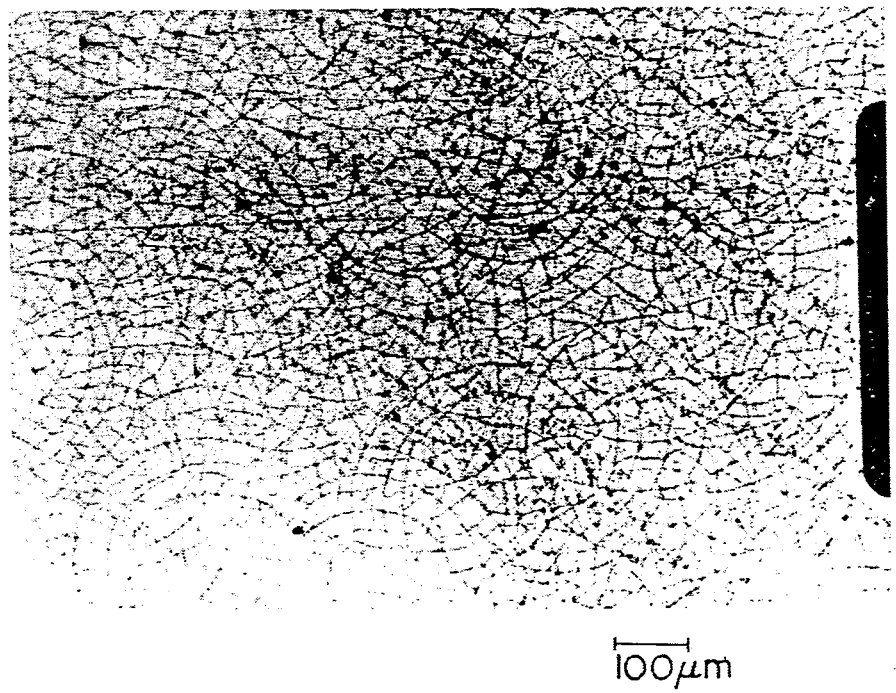
FIG. 1 is a microphotograph showing an etched surface of a ceramic coating layer having cracks.

The coating treatment of the cemented carbide tool is conducted by means of a CVD process. A coating layer is composed of one or more layers selected from the group consisting of TiC, TiN, Ti(C,N) and $Al_2O_3$. The lower limit of the thickness of the coating layer should be not less than 2 $\mu$m in view of the wear resistance, and the upper limit should be not more than 20 $\mu$m in view of the fracture resistance. Fine cracks are necessary for enhancing the fracture resistance of the tool. Generally, when ceramics is coated on a cemented carbide, a residual tensile stress is present in the coating layer, and therefore the rupture strength of the coated tool is lowered, so that the tool is liable to occur fracture It is thought that the fine cracks improve the fracture resistance because the fine cracks release the residual stress.

The average value of the depths of the cracks, measured perpendicularly from the surface of the coating layer, should be not less than the thickness of the coating layer and is not more than the coating thickness plus 5 $\mu$m. Although it is most preferred that the bottoms of the cracks reside in the interface between the coating layer and the substrate, the effect achieved by the cracks will not be adversely affected if the depth of intrusion of the cracks into the substrate is not more than 5 μm. The reason is that if the crack depth in the substrate of cemented carbide exceeds 5 μm, the fracture resistance of the tool is abruptly lowered. The average value of the widths of the cracks should be not more than 2 μm. The reason is that if the crack width increases, the wear resistance is markedly lowered although the fracture resistance of the tool is improved. The average value of the intervals between the cracks should be in the range of between 10 μm and 100 μm. If this lower limit is less than 10 μm, the wear resistance of the coating layer is lowered. If this upper limit exceeds 100 μm, the crack density becomes too low, and the fracture resistance can not be enhanced satisfactorily.

Examples of methods of forming network-like fine cracks in the coating layer include a method of blasting hard particles (made, for example, of steel and cast iron) to the surface of the coating layer, a method of diamond-grinding the coating surface to slightly reduce the thickness, a method of applying ultrasonic wave pressure, and the above-mentioned quick heating and cooling method using the radiation of a high-density energy beam.

One suitable example of such hard particles for blasting is as follows:
a) Material: Steel
b) Hardness: HRC35 to HRC50
c) Shape: Spherical shape
d) Size (outer diameter): 200 to 800 μm Examples of the high-density energy beam include well-known laser beam and plasma jet. When the surface of the coating layer is scanned by such high-density energy beam, the coating layer is locally heated quickly, and subsequently is cooled quickly by a self cooling. As a result, the fine network-like cracks are formed in the coating layer.

Figure 2:
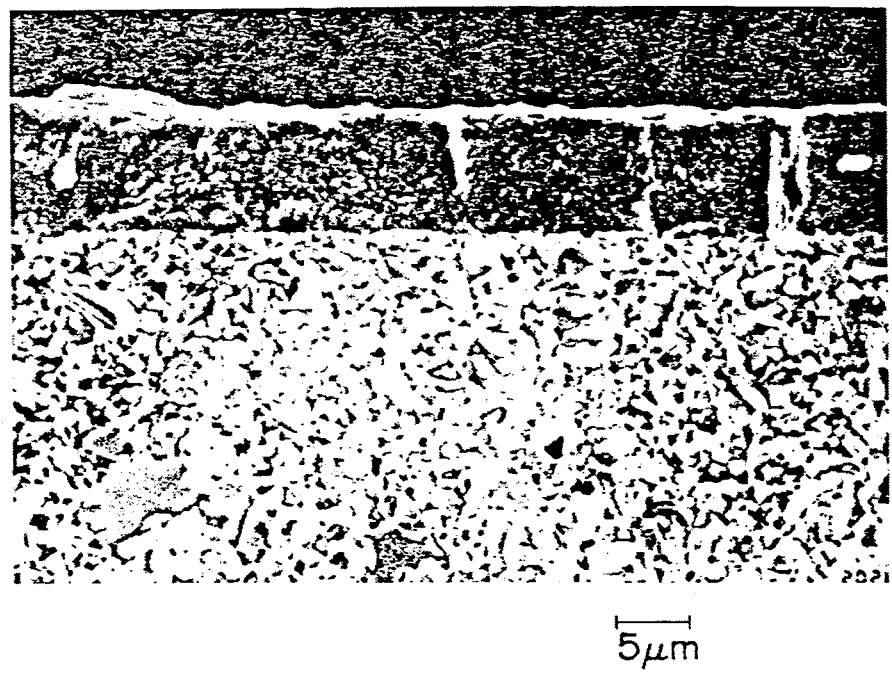
FIG. 2 is a microphotograph showing a cross-sections, which is perpendicular to the surface of the ceramics coating layer, of the layer and a substrate.

To measure the coating cracks, it is necessary to etch the coating. For effecting this etching, for example, the tool with the coating layer is dipped in a mixture of nitric acid and hydrofluoric acid for 5 minutes, and then is rinsed with water. After etching, when the coating surface and the cross-section of the tool are observed by an electronic microscope (SEM) or an optical microscope, the crack depths and widths were confirmed in the test by cutting the tool and by observing its cross-section by means of SEM. The cracks are recognized as shown in FIGS. 1 and 2. Based on ten sheets of photograph of the fractured surface photographed respectively from 10 fields of view at 1,000 magnifications, the average value of the crack depths and the average value of the crack widths were measured. The crack interval was also measured by observing the etched surface of the coating in a similar manner.

The method of measuring the crack interval is carried out in the following manner.

At least three straight lines each sufficiently longer than the crack interval are drawn on the photograph of the coating surface in arbitrary directions, and the length of each straight line is divided by the number of cracks, extending across the straight line, and the photograph magnification. Then, the average of the thus obtained values with respect to all the straight lines is used as the average crack interval. In this case, depending on the size of the crack interval of the coating layer, the magnification of the photograph to be observed is determined.

Next, results of tests with respect to tools of the present invention and comparative tools will be given below. The comparative tools are two kinds, that is, one kind of tools having a coating layer by a CVD process but having no crack, and another kind of tools having such cracks that one of the crack depth, the crack width and the crack interval does not fall within the range of the present invention.

EXAMPLE 1

Crack dimensions and crack distribution of sample tools as well as their cutting performance are shown in Table 1. The cemented carbide for the sample tool contained 87.5 wt.% of tungsten carbide (WC), 2.1 wt.% of titanium carbide (TiC), 3.4 wt.% of tantalum carbide (TaC) and 7.0 wt.% of cobalt (Co). The starting material was subjected to mix-milling granulation, sintering and grinding, thereby producing a substrate in the form of a square plate having a thickness of 4 mm, each side of the square substrate being 12.7 mm. By a CVD process, a TiC layer was deposited on each of the substrates, and subsequently a Ti(C, N) layer was deposited on the TiC layer, and subsequently an $Al_2O_3$ layer was deposited on the Ti(C, N) layer, thus forming these three layers on the substrate to thereby prepare the tool (i.e., indexable cutting insert), the coating layer having a thickness of 4 to 20 μm. Steel balls having an average particle size of 300 μm were applied to the thus prepared tool at a velocity of 50 m/sec. at an incident angle of 70° to 90° to form cracks therein. The dimensions and distribution of the cracks were measured by fracturing the tool and observing its cross section (i.e., fractured surface) by means of an electronic microscope (SEM). Based on ten sheets of photograph taken respectively from 10 fields of view at 1,000 magnifications, the average value of the crack depth and the average value of the crack width were measured. The crack interval was the average value of the intervals between the adjoining cracks, and was measured from the above photographs in the above-mentioned manner.

The performances of the coated tools of the invention and the comparative tools were evaluated through cutting. The conditions of this evaluation were as follows.
1) Interrupted Cutting
   Workpiece: JIS S48C (Five grooves with a width of 10 mm were formed at equal intervals in a round bar with a diameter of 60 mm in parallel relation to the direction of rolling).
   Cutting speed: 170 m/min.
   Feed: 0.25 mm/rev.
   Depth of cut: 2.5 mm.
   Criterion of tool life: Fracture of a cutting edge of the tool.
2) Lathe Cutting
   Workpiece: JIS S48C; Round bar with a diameter of 60 mm.
   Cutting speed: 300 m/min.
   Feed: 0.25 mm/rev.
   Depth of cut: 2.5 mm.
   Critrion of tool life: Depth of crater KT=50 μm.

The fracture resistance of the tool was evaluated based on the number of impingement upon the grooves until the fracture of the tool in the interrupted cutting. The wear resistance of the tool was evaluated based on the cutting time required until the depth of crater reached 50 μm in the lathe cutting.

TABLE 1

|  | | Coating layer thickness (μm) | Average value of crack depth (μm) | Average value of crack width (μm) | Average value of crack interval (μm) | Wear resistance (min.) | Fracture resistance (cycle) |
| --- | --- | --- | --- | --- | --- | --- | --- |
| Tool of | 1 | 10 | 10 | 2 | 14 | 21 | $7.2 \times 10^4$ |
| The | 2 | 10 | 11 | 1 | 24 | 23 | $8.1 \times 10^4$ |
| Present | 3 | 10 | 13 | 2 | 95 | 22 | $6.1 \times 10^4$ |
| Invention | 4 | 20 | 20 | 2 | 28 | 29 | $8.0 \times 10^4$ |
|  | 5 | 20 | 24 | 1 | 53 | 34 | $7.3 \times 10^4$ |
| Compara- | 1 | 4 | 0 | 0 | — | 8 | $5.1 \times 10^2$ |
| tive Tool | 2 | 8 | 0 | 0 | — | 10 | $1.3 \times 10^3$ |
|  | 3 | 10 | 0 | 0 | — | 12 | $3.2 \times 10^3$ |
|  | 4 | 20 | 12 | 2 | 52.0 | 31 | $2.5 \times 10^3$ |
|  | 5 | 20 | 42 | 5 | 40 | 33 | $2.0 \times 10^2$ |

As is apparent from the above test results, the tools of the present invention are very much superior in fracture resistance to the comparative tools. The lifetime of the tools of the present invention is more than ten times longer than that of the comparative tools in the interrupted cutting. The wear resistance of the tools of the present invention is of generally the same level as that of the comparative tools. As a result, it will be appreciated that the effects of the fine cracks are very conspicuous.

EXAMPLE 2

Crack dimensions and crack distribution of sample tools as well as their cutting performance are shown in Table 2. The cemented carbide for the sample tool contained 84 wt.% of tungsten carbide (WC), 7 wt.% of titanium carbide (TiC), 5 wt.% of tantalum carbide (TaC) and 4 wt.% of cobalt (Co). The starting material was subjected to mix-milling granulation, sintering and grinding, thereby producing a substrate in the form of a square plate having a thickness of 4 mm, each side of the square substrate being 12.7 mm. By a CVD process, a TiC layer was deposited on each of the substrates, and subsequently a Ti(C, N) layer was deposited on the TiC layer, and subsequently an Al₂O₃ layer was deposited on the Ti(C, N) layer, thus forming these three layers on the substrate to thereby prepare the tool (i.e., indexable cutting insert). The thickness of the coating layer on some of the substrates was 8 μm, and the thickness of the coating layer on the other substrates was 4 μm. Steel balls having an average particle size of 200 μm were applied to the thus prepared tool at a velocity of 10 to 80 m/sec. at an incident angle of 70° to 90° to form cracks therein. The dimensions and distribution of the cracks were measured by fracturing the tool and observing its cross section (i.e., fractured surface) by means of an electronic microscope (SEM) Based on ten sheets of photograph taken respectively from 10 fields of view at 1,000 magnifications, the average value of the crack depth and the average value of the crack width were measured. The crack interval was the average value of the intervals between the adjoining cracks, and was measured from the above photographs in the above-mentioned manner.

The performances of the coated tools of the invention and the comparative tools were evaluated through cutting. The conditions of this evaluation were as follows.

1) Interrupted Cutting

Workpiece: JIS S45C (Five grooves with a width of 10 mm were formed at equal intervals in a round bar with a diameter of 60 mm in parallel relation to the direction of rolling).

Cutting speed: 150 m/min.

Feed: 0.25 mm/rev.

Depth of cut: 2.0 mm.

Criterion of tool life: Fracture of a cutting edge of the tool.

2) Lathe Cutting

Workpiece: JIS S45C; Round bar with a diameter of 60 mm.

Cutting speed: 300 m/min.

Feed: 0.25 mm/rev.

Depth of cut: 2.0 mm.

Critrion of tool life: Depth of crater KT=50 μm.

The fracture resistance of the tool was evaluated based on the number of impingement upon the grooves until the fracture of the tool in the interrupted cutting. The wear resistance of the tool was evaluated based on the cutting time required until the depth of crater reached 50 μm in the lathe cutting. As is clear from the test results shown in Table 2, the tools of the present invention are very much superior in fracture resistance to the comparative tools. The tool life of the present invention is more than ten times longer than that of the comparative tools in the interrupted cutting. The wear resistance of the tools of the present invention is of generally the same level as that of the comparative tools. As a result, it will be appreciated that the effects of the fine cracks are very conspicuous.

TABLE 2

|  | | Coating layer thickness (μm) | Average value of crack depth (μm) | Average value of crack width (μm) | Average value of crack interval (μm) | Wear resistance (min.) | Fracture resistance (cycle) |
| --- | --- | --- | --- | --- | --- | --- | --- |
| Tool of | 1 | 8 | 8 | 2 | 30 | 19 | $7 \times 10^4$ |
| The | 2 | 8 | 9 | 1 | 15 | 15 | $8 \times 10^4$ |
| Present | 3 | 8 | 10 | 2 | 82 | 22 | $6 \times 10^4$ |
| Invention | 4 | 4 | 4 | 2 | 25 | 18 | $8 \times 10^4$ |
|  | 5 | 4 | 9 | 1 | 55 | 20 | $7 \times 10^4$ |
| Compara- | 1 | 8 | 0 | 0 | — | 23 | $5 \times 10^2$ |
| tive Tool | 2 | 4 | 0 | 0 | — | 15 | $1 \times 10^3$ |
|  | 3 | 8 | 5 | 1 | 360 | 20 | $3 \times 10^3$ |
|  | 4 | 8 | 9 | 2 | 520 | 20 | $2.5 \times 10^3$ |

TABLE 2-continued

| Coating layer thickness ($\mu$m) | Average value of crack depth ($\mu$m) | Average value of crack width ($\mu$m) | Average value of crack interval ($\mu$m) | Wear resistance (min.) | Fracture resistance (cycle) |
| --- | --- | --- | --- | --- | --- |
| 5 | 8 | 18 | 5 | 40 | 18 | $2 \times 10^2$ |

EXAMPLE 3

Crack dimensions and crack distribution of sample tools as well as their cutting performance are shown in Table 3. The cemented carbide for the sample tool contained 47.0 wt.% of titanium carbo-nitride (Ti(C, N), 7.5 wt.% of molybdenum carbide (Mo$_2$C), 16.5 wt.% of tungsten carbide, 10.0 wt.% of tantalum carbide, 5.0 wt.% of niobium carbide, 5.0 wt.% of nickel and 9.0 wt.% of cobalt (Co). The starting material was subjected to mix-milling granulation, sintering and grinding, thereby producing a substrate in the form of a square plate having a thickness of 4 mm, each side of the square substrate being 12.7 mm. By a CVD process, a TiC layer was deposited on each of the substrates, and subsequently a Ti(C, N) layer was deposited on the TiC layer, and subsequently an Al$_2$O$_3$ layer was deposited on the Ti(C, N) layer, thus forming these three layers on the substrate to thereby prepare the tool (i.e., indexable cutting insert), the coating layer having a thickness of 3 to 9 $\mu$m. Balls of cast iron having an average particle size of 200 $\mu$m were applied to the thus prepared tool at a velocity of 10 to 80 m/sec. at an incident angle of 70° to 90° to form cracks therein.

The dimensions and distribution of the cracks were measured by fracturing the tool and observing its cross section (i.e., fractured surface) by means of an electronic microscope (SEM). Based on ten sheets of photograph taken respectively from 10 fields of view at 1,000 magnifications, the average value of the crack depth and the average value of the crack width were measured. The crack interval was the average value of the intervals between the adjoining cracks, and was measured from the above photographs in the above-mentioned manner.

The performances of the coated tools of the invention and the comparative tools were evaluated through cutting. The conditions of this evaluation were as follows.

1) Interrupted Cutting
Workpiece: JIS S38C (Five grooves with a width of 10 mm were formed at equal intervals in a round bar with a diameter of 60 mm in parallel relation to the direction of rolling).
Cutting speed: 170 m/min.
Feed: 0.15 mm/rev.
Depth of cut: 1.0 mm.
Criterion of tool life: Fracture of a cutting edge of the tool.

2) Lathe Cutting
Workpiece: JIS S38C; Round bar with a diameter of 60 mm.
Cutting speed: 200 m/min.
Feed: 0.15 mm/rev.
Depth of cut: 1.0 mm.
Critrion of tool life: Depth of crater KT=50 $\mu$m.

The fracture resistance of the tool was evaluated based on the number of impingement upon the grooves until the fracture of the tool in the interrupted cutting. The wear resistance of the tool was evaluated based on the cutting time required until the depth of crater reached 50 $\mu$m in the lathe cutting. As is clear from the test results shown in Table 3, the tools of the present invention are very much superior in fracture resistance to the comparative tools. The life of the tools of the present invention is more than ten times longer than that of the comparative tools in the interrupted cutting. The wear resistance of the tools of the present invention is of generally the same level as that of the comparative tools. As a result, it will be appreciated that the effects of the fine cracks are very conspicuous.

TABLE 3

| | | Coating layer thickness ($\mu$m) | Average value of crack depth ($\mu$m) | Average value of crack width ($\mu$m) | Average value of crack interval ($\mu$m) | Wear resistance (min.) | Fracture resistance (cycle) |
| --- | --- | --- | --- | --- | --- | --- | --- |
| Tool of | 1 | 9 | 9 | 1 | 18 | 45 | $5.2 \times 10^4$ |
| The | 2 | 9 | 10 | 2 | 35 | 47 | $5.1 \times 10^4$ |
| Present | 3 | 9 | 12 | 2 | 78 | 52 | $4.5 \times 10^4$ |
| Invention | 4 | 3 | 3 | 1 | 25 | 32 | $5.7 \times 10^4$ |
| | 5 | 3 | 7 | 2 | 55 | 41 | $5.0 \times 10^4$ |
| Compara- | 1 | 9 | 0 | 0 | — | 56 | $4.2 \times 10^2$ |
| tive Tool | 2 | 4 | 0 | 0 | — | 43 | $1.1 \times 10^3$ |
| | 3 | 9 | 5 | 1 | 320 | 53 | $3.1 \times 10^3$ |
| | 4 | 9 | 9 | 4 | 518 | 56 | $2.5 \times 10^3$ |
| | 5 | 9 | 18 | 5 | 45 | 49 | $1.8 \times 10^2$ |

What is claimed is:

1. A cemented carbide tool of excellent wear resistance and fracture resistance comprising a substrate of cemented carbide and a ceramic coating layer made of at least one material selected from the group consisting of Tic, Ti(C,N), Al$_2$O$_3$ and TiN and by a CVD process;
   the thickness of the coating layer being in the range of between 2 $\mu$m to 20 $\mu$m, the coating layer having cracks of such a depth that the cracks extend perpendicularly from a surface of the coating layer to the substrate;
   the cracks being formed in a network-like pattern to minutely divide the coating layer; and
   the cracks meeting the following requirements:
   (A) the average value of the depths of the cracks in a direction perpendicular to the surface of the coating layer being no less than the thickness of the coating layer and no more than a value equal to the coating thickness plus 5 $\mu$m;

(B) the average value of widths of the cracks being no more than 2 μm; and (C) the average value of intervals between the cracks being no less than 10 μm and no more than 100 μm.

2. A cemented carbide tool according to claim 1, in which the substrate is made of WC-based cemented carbide.

3. A cemented carbide tool according to claim 2, in which the thickness of the coating layer is in the range of between 2 μm and 10 μm.

4. A cemented carbide tool according to claim 2, in which the thickness of the coating layer is in the range of between 10 μm and 20 μm.

5. A cemented carbide tool according to claim 1, in which the substrate is made of one of TiC-based cemented carbide and Ti(C,N)-based cemented carbide.

* * * * *